(12) United States Patent
Barbot et al.

(10) Patent No.: US 11,804,563 B2
(45) Date of Patent: Oct. 31, 2023

(54) METHOD FOR BINDING PHOTOVOLTAIC CELLS TO A SUBSTRATE IMPREGNATED WITH CROSSLINKABLE POLYMER MATERIAL

(71) Applicant: COMMISSARIAT A L'ENERGIE ATOMIQUE ET AUX ENERGIES ALTERNATIVES, Paris (FR)

(72) Inventors: Anthony Barbot, Grenoble (FR); Yannick Roujol, Grenoble (FR); Caroline Seraine, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 346 days.

(21) Appl. No.: 17/312,742

(22) PCT Filed: Dec. 11, 2019

(86) PCT No.: PCT/FR2019/053025
§ 371 (c)(1),
(2) Date: Jun. 10, 2021

(87) PCT Pub. No.: WO2020/120907
PCT Pub. Date: Jun. 18, 2020

(65) Prior Publication Data
US 2022/0059712 A1 Feb. 24, 2022

(30) Foreign Application Priority Data
Dec. 13, 2018 (FR) ...................................... 18 72843

(51) Int. Cl.
*H01L 31/048* (2014.01)
*D06M 15/643* (2006.01)
*H01L 31/18* (2006.01)

(52) U.S. Cl.
CPC ....... *H01L 31/0481* (2013.01); *D06M 15/643* (2013.01); *H01L 31/18* (2013.01)

(58) Field of Classification Search
CPC .......... B32B 2262/10; B32B 2262/101; B32B 2262/106; H01L 31/042; H01L 31/0481;
(Continued)

(56) References Cited

U.S. PATENT DOCUMENTS 5,298,085 A * 3/1994 Harvey ................. H01L 31/048
428/113
6,320,115 B1 * 11/2001 Kataoka ............. B32B 17/10788
156/286

(Continued)

OTHER PUBLICATIONS

International Search Report dated Apr. 3, 2020 in PCT/FR2019/053025 filed Dec. 11, 2019, 2 pages.

*Primary Examiner* — Mayla Gonzalez Ramos
(74) *Attorney, Agent, or Firm* — Oblon, McClelland, Maier & Neustadt, L.L.P.

(57) ABSTRACT

A method for binding photovoltaic cells to a substrate, each photovoltaic cell comprising a rear face and a front face, comprises: providing the substrate, said substrate being flexible and impregnable; impregnating portions of the substrate with a crosslinkable polymer material, said portions being impregnated along the thickness of the substrate, with a view to bonding the photovoltaic cells to the substrate; bringing the rear faces of the photovoltaic cells into contact with the impregnated portions of the substrate; crosslinking the crosslinkable polymer material.

10 Claims, 4 Drawing Sheets

(58) Field of Classification Search
CPC ...... H01L 31/18; D06M 15/643; H02S 30/20; Y02E 10/50
See application file for complete search history.

(56) References Cited

U.S. PATENT DOCUMENTS 9,842,952 B2  12/2017  Howell et al.
2011/0203664 A1* 8/2011  Howell ............. B32B 17/10798
                                              257/E31.117

* cited by examiner

METHOD FOR BINDING PHOTOVOLTAIC CELLS TO A SUBSTRATE IMPREGNATED WITH CROSSLINKABLE POLYMER MATERIAL

TECHNICAL FIELD OF THE INVENTION

The technical field of the invention relates to binding photovoltaic cells to a substrate, notably in order to form a photovoltaic module, for example of the type to be deployed in space. In particular, the invention relates to a method for binding photovoltaic cells to a substrate, each photovoltaic cell comprising a rear face and a front face.

PRIOR ART

In the field of space technology, it is known practice to use photovoltaic cells which are interconnected and encapsulated individually using an individual protective element also called the "cover glass". These photovoltaic cells are called encapsulated solar cells or CICs (for "cover glass interconnected solar cells"). These photovoltaic cells are bonded to a rigid or flexible substrate, for example using silicone. The use of a flexible substrate is advantageous in the context of the manufacture of a photovoltaic module able to be deployed in space. To achieve bonding, silicone is usually deposited on the substrate in a particular pattern using a robot referred to as a "bonding" robot before laying the photovoltaic cells on the deposited silicone, then pressing the photovoltaic cells (notably by pressure exerted on said cells) toward the substrate until the silicone is completely crosslinked.

The deposition of silicone by the bonding robot on the substrate has the following drawbacks:
- the amount of silicone used and the pattern produced must be correctly adjusted, this complicating the method for binding the photovoltaic cells to the substrate,
- gas bubbles, notably air bubbles, formed during the deposition of the silicone may remain trapped in the crosslinked silicone, this presenting a risk as regards the reliability of the photovoltaic module in the sense that the presence of gas bubbles may cause degradation, explosion for example, of the photovoltaic module when the latter is deployed in space.

Patent application US2017/0301811 describes binding a solar cell to a flexible carrier using an adhesive. The adhesive is deposited on the flexible carrier or on the rear face of the solar cell. Binding in this way has the drawback of promoting the presence of gas bubbles in the adhesive.

Patent application US2011/0290304 describes a photovoltaic module comprising a textile substrate. This textile substrate comprises conductors. Solar tiles of the photovoltaic module each make contact with at least one conductor. The textile and the solar tiles may then be encapsulated using a liquid silicone resin. Encapsulating in this way has the drawback of promoting the presence of gas bubbles in the encapsulant.

U.S. Pat. No. 9,842,952 B2 is known, which relates to a method for forming a photovoltaic matrix array using a liquid silicone composition and a non-woven textile mat. The mat is at least partially coated with the liquid silicone composition after or simultaneously with the deposition of the liquid silicone composition on photovoltaic cells.

The United States patent published under the number U.S. Pat. No. 5,298,085 is known, which relates to solar cells bonded to a fabric using cured silicone.

OBJECT OF THE INVENTION

The purpose of the invention is to propose a binding method which is simpler to implement, notably by avoiding the adjustment of the pattern and of the amount of material to be used to bond the photovoltaic cells to the substrate. Preferably, this method is suitable for forming a photovoltaic module intended to be used in space.

To this end, the invention relates to a method for binding photovoltaic cells to a substrate, each photovoltaic cell comprising a rear face and a front face, this binding method being characterized in that it comprises: providing the substrate, said substrate being flexible and impregnable; impregnating portions of the substrate with a crosslinkable polymer material, said portions being impregnated along the thickness of the substrate, with a view to bonding the photovoltaic cells to the substrate; bringing the rear faces of the photovoltaic cells into contact with the impregnated portions of the substrate; crosslinking the crosslinkable polymer material.

Such a binding method makes it possible to bond the photovoltaic cells to the substrate without having to be concerned with producing particular patterns in crosslinkable polymer material since the substrate is impregnated, at least via its portions intended to make contact with the photovoltaic cells, with the crosslinkable polymer material. Furthermore, the impregnation with the crosslinkable polymer material makes it possible to obtain, after crosslinking of the crosslinkable polymer material, a closer bond between the photovoltaic cells and a carrier notably composed of a matrix of crosslinked polymer material into which the substrate is integrated, the photovoltaic cells being bonded to this carrier.

The binding method may further comprise one or more of the following features:
- each impregnated portion of the substrate has a surface only part of which makes contact with the rear face of the photovoltaic cell brought into contact with said impregnated portion of the substrate;
- the binding method comprises a step of laminating the substrate and the photovoltaic cells ensuring the crosslinkage of the crosslinkable polymer material;
- in the lamination step: the front faces of the photovoltaic cells are oriented toward a table of a laminator; a soft sheet is arranged between the photovoltaic cells and the table of the laminator; bringing each of the photovoltaic cells closer to the table of the laminator causes recesses to be formed in the soft sheet;
- the binding method comprises forming a stack comprising successively, from the bottom of the stack to the top of the stack, a first rigid carrier, the substrate the portions of which are impregnated with the crosslinkable polymer material, the photovoltaic cells, the soft sheet, a second rigid carrier, and the binding method is such that: the second carrier is placed on the table of the laminator; the lamination step ensures the lamination of the stack devoid of the first carrier; at the end of the lamination step, the photovoltaic cells are each bonded to the substrate by crosslinked polymer material;
- in order to impregnate the portions, forming the stack comprises successively: forming a layer of crosslinkable polymer material; bringing a first face of the substrate into contact with the layer of crosslinkable polymer material; adding crosslinkable polymer material to a second face of the substrate opposite the first face of the substrate; smoothing the substrate in order to increase the uniformity of the impregnation of the portions of the substrate with the crosslinkable polymer material;

the photovoltaic cells brought into contact with the impregnated portions of the substrate are interconnected and each comprise an individual protective element forming its front face;

the crosslinkable polymer material is chosen from the family of silicones;

the substrate is a fabric;

the fabric is chosen from: a glass-fiber fabric, an aramid-fiber fabric and an aromatic-polyester fabric;

the weight per unit area of the fabric is between 20 g/m$^2$ and 300 g/m$^2$;

the rear faces of the photovoltaic cells are brought into contact with the impregnated portions of the substrate after the impregnation of the portions of the substrate with the crosslinkable polymer material.

Other advantages and features relating to the invention will emerge clearly from the detailed description which follows.

BRIEF DESCRIPTION OF THE DRAWINGS

The invention will be better understood on reading the detailed description which follows, which description is given solely by way of non-limiting example and with reference to the accompanying drawings listed below.

In these figures, the same references have been used to designate the same elements.

DETAILED DESCRIPTION

In the present description, a value between two limits is to be understood as inclusive of limits.

Conventionally, a photovoltaic cell has two opposite faces called the front face and the rear face, respectively. The front face of the photovoltaic cell is a face configured to receive radiation, notably solar radiation, to be converted into electrical energy. Notably, each photovoltaic cell of the photovoltaic module described below has a thickness of between 10 micrometers and 300 micrometers.

Preferably, the photovoltaic cells targeted in the present description are encapsulated solar cells or CICs (for "cover glass interconnected solar cells"). In other words, they are photovoltaic cells which are interconnected and each comprise an individual protective element encapsulating said photovoltaic cell on the front face.

In the present description, "based on" is understood to mean "comprises at least predominantly". In this sense, in the context of "an element based on a material", "based on" may also denote "consists of", notably if the material in question is the only one entering into the composition of said element.

In the present description, the term "space" corresponds to beyond the earth's atmosphere.

Figure 1:
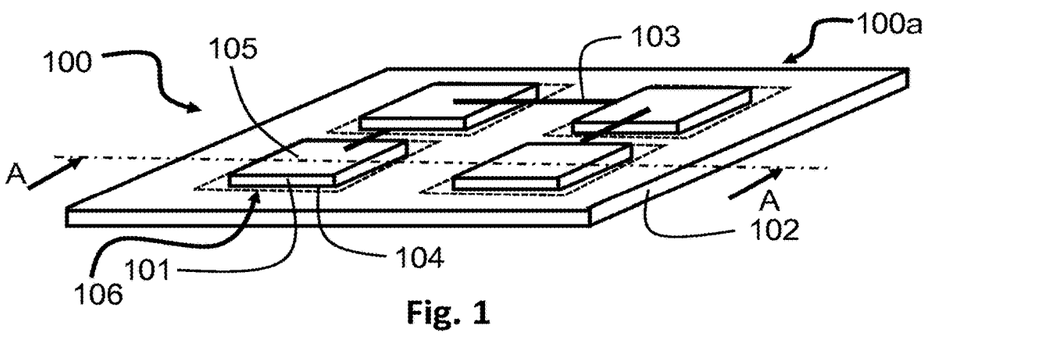
FIG. 1 illustrates a perspective view of a photovoltaic module obtained by a binding method according to the present invention.

FIG. 1 shows a photovoltaic module 100 comprising photovoltaic cells 101, for example four in number, bonded to a substrate 102 notably by a crosslinked polymer material. In fact, the photovoltaic module 100 may comprise a carrier 100a formed by the substrate 102 and crosslinked polymer material which extends into the substrate 102. "Substrate" is understood to mean here a carrier element to which the photovoltaic cells 101 are secured. This substrate 102 is notably flexible. The carrier 100a may also be flexible so as to be bent or folded. The photovoltaic cells 101 are notably interconnected by electrical connection buses 103, for example in series as shown schematically in FIG. 1.

By "flexible substrate", what is meant is that the substrate 102 is flexible and may notably be deformed/folded, whether this is during a lamination step as described below, or during deployment or folding of the photovoltaic module 100 comprising this substrate 102. This flexibility of the substrate 102 may be conferred by a drape coefficient of the substrate 102 of between 0 and 0.8, notably when the substrate 102 is a fabric. Such flexibility is very particularly suitable in the context of a space application or in the context of a nomadic terrestrial application where it is the aim to have a flexible/foldable photovoltaic module.

By "impregnable substrate", what is meant is that the substrate allows material, notably the crosslinkable polymer material as described below, to diffuse into it.

Figure 2:
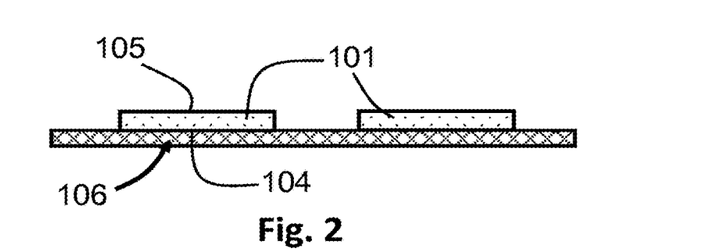
FIG. 2 is a sectional view along a section A-A of FIG. 1.
Figure 3:
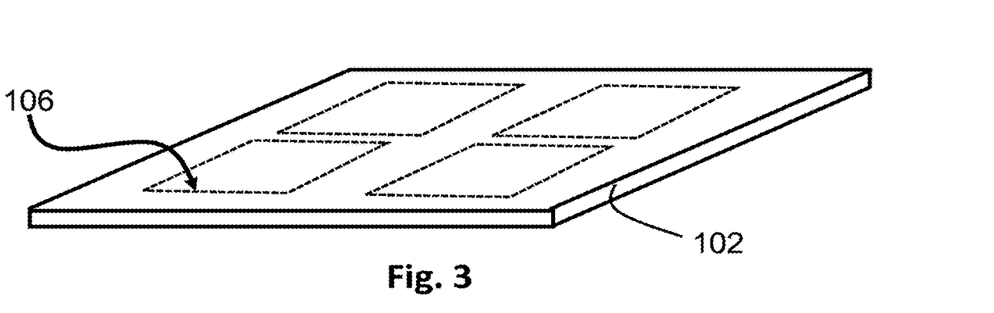
FIG. 3 illustrates a perspective view of a substrate comprising portions impregnated with a crosslinkable polymer material.

The invention relates to a method for binding photovoltaic cells 101 to the substrate 102, notably in order to form the photovoltaic module 100. Each photovoltaic cell 101 comprises a rear face 104 and a front face 105 (FIGS. 1 and 2). The binding method comprises: providing the substrate 102 (FIG. 3), said substrate 102 being flexible and capable of being impregnated notably with a crosslinkable polymer material; impregnating portions 106 of the substrate 102 (notably these portions 106 of the substrate 102 are below simply referred to as portions 106) with the crosslinkable polymer material 107 (FIGS. 3 and 4), said portions 106 being impregnated along the thickness of the substrate 100, with a view to bonding (that is to say with the intention of bonding) the photovoltaic cells 101 to the substrate 102 (the impregnated portions 106 are therefore intended to bond the photovoltaic cells 101 to the substrate 102); bringing the rear faces 104 of the photovoltaic cells 101, which are notably interconnected, into contact with the impregnated portions 106 of the substrate 102 (FIGS. 1 to 4, the portions 106 have been drawn with dotted lines in FIGS. 1 and 3); crosslinking the crosslinkable polymer material 107, this resulting in bonding of the photovoltaic cells 101 to the substrate 102. Unlike conventional bonding using a bonding robot, the binding method according to the present invention makes it possible, by virtue of the impregnation of the portions 106 of the substrate 102, to obtain privileged zones for attaching the photovoltaic cells 101 to the substrate not requiring the production of complex suitable patterns: this results in a simplification of the implementation of the binding method and in faster production, in contrast with the laborious optimization of the deposition of silicone and of the exerted pressure described in the section regarding the prior art. Notably, at the end of the crosslinking of the crosslinkable polymer material 107, the substrate 102 and the crosslinked polymer material form the carrier 100a belonging to the photovoltaic module 100 to which the photovoltaic cells 101 are attached (FIG. 1). This carrier 100a is then preferably composed of a matrix of crosslinked polymer material integrating all or part of the substrate 102. Subsequently, the formulation "impregnation of the substrate 102" or "impregnated substrate 102" equally well encompasses the impregnation (and more particularly the result of the impregnation) of the portions 106 and for example of only these portions 106 with the crosslinkable polymer material 107, or of the entire substrate 102 with the crosslinkable (or where appropriate crosslinked) polymer material 107. In other words, the binding method notably comprises impregnating at least the portions 106 of the substrate 102. According to another formulation, the binding method may comprise impregnating the substrate 102 notably such that impregnation of only the portions 106 of the substrate 102 or impregnation of the entire substrate 102, which then comprises the impregnated portions 106 intended for bonding the photovoltaic cells 101, results. Furthermore, by virtue of the impregnation of the substrate 102 with the crosslinkable polymer material 107, a closer bond is obtained between the photovoltaic cells 101 and the carrier 100a of the photovoltaic module 100. This binding method also allows, by virtue of the impregnation of the substrate 102 with the crosslinkable polymer material 107, and preferably in combination with the lamination step described below, better degassing of gas bubbles (for example air bubbles) formed within the crosslinkable polymer material 107 with which the substrate 102 is impregnated.

Figure 4:
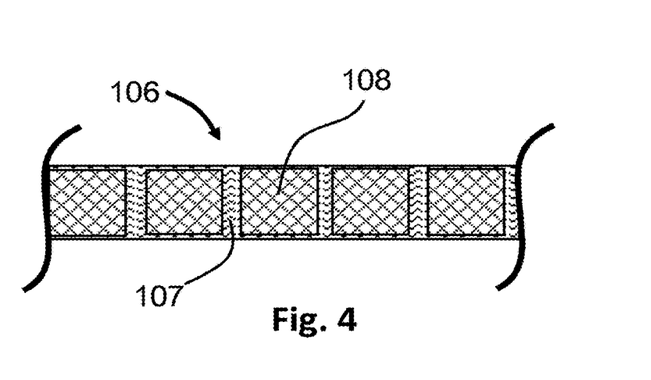
FIG. 4 illustrates a sectional view, parallel to the thickness of the substrate, of part of an impregnated portion of the substrate of FIG. 3.

The impregnation of the portions 106 with the crosslinkable polymer material 107 along the thickness of the substrate 102 makes it possible for the crosslinkable polymer material 107 to spread diffusely, that is to say uniformly, through the portions 106. Notably, the portions 106 are then said to be fully impregnated with the crosslinkable polymer material 107. This makes it possible to limit the presence of gas bubbles within the crosslinked polymer material obtained by crosslinking the crosslinkable polymer material 107. For example, FIG. 4 shows a sectional view of part of a portion 106 of the substrate 102 impregnated with the crosslinkable polymer material 107, this crosslinkable polymer material 107 being notably present between threads 108 of the substrate 102 when said substrate is a fabric. By "impregnation along the thickness of the substrate 102", what is meant is that the crosslinkable polymer material 107 is present within said portion 106 through its entire thickness.

Notably, each impregnated portion 106 of the substrate 102 has a surface only part of which makes contact with the rear face 104 of the photovoltaic cell 101 brought into contact with said impregnated portion 106 of the substrate 102. In other words, each portion 106 protrudes laterally on the periphery of the photovoltaic cell 101 with which said portion 106 makes contact. This has the advantage of ensuring adequate bonding of each photovoltaic cell 101 so as to avoid the risk of detachment, and the advantage of allowing uniform heat dissipation under said photovoltaic cell 101. If the dimensions of each impregnated portion 106 of the substrate 102 were equal to the dimensions of the rear face 104 of the photovoltaic cell 101 to be bonded, this would complicate the binding method by requiring great precision when positioning the photovoltaic cells 101 on the substrate 102.

In particular, the rear faces 104 of the photovoltaic cells 101 are brought into contact with the impregnated portions 106 of the substrate 102 after the portions 106 of the substrate 102 have been impregnated with the crosslinkable polymer material 107.

"Crosslinkable polymer material 107" is understood to mean "polymer material capable of being crosslinked".

The crosslinkable polymer material 107 is preferably in the liquid state. By "crosslinkable polymer material in the liquid state", what is meant is that the crosslinkable polymer material 107 has a tendency to flow due to the weak cohesion of the molecules from which it is composed. Notably, the liquid state of the crosslinkable polymer material 107 corresponds to a polymer material the viscosity of which is preferably between 1 Pa·s and 50 Pa·s at a temperature of 25° C. In the present description, the viscosity values are given at atmospheric pressure. Such viscosity values make it possible to suitably impregnate the substrate 102. In particular, the viscosity of the crosslinkable polymer material may be strictly greater than 5 Pa·s at a temperature of 25° C. and be less than or equal to 50 Pa·s at a temperature of 25° C., and preferably this viscosity is strictly greater than 5 Pa·s at a temperature of 25° C. and is less than or equal to 10 Pa·s at a temperature of 25° C.

The crosslinkable polymer material 107 is notably a polymer material the crosslinkage of which is strictly below its gel point. The gel point of a polymer material is characterized by a sharp increase in the complex viscosity of this polymer material and in the complex shear modulus of this polymer material. At the gel point and beyond, a three-dimensional network forms and the chains of this polymer material can no longer slide over one other.

Preferably, in the present description any polymer material mentioned, whether crosslinked or crosslinkable, may be chosen from the family of silicones, which is also called the family of polysiloxanes. Such a material is very particularly suitable for bonding the photovoltaic cells 101 to the substrate 102, notably for an application in the field of space technology. Subsequently, silicone is defined to be a polymer chosen from the family of silicones.

Furthermore, the crosslinkable polymer material may also comprise additives in order to prevent it from yellowing after it has been crosslinked.

It follows from what has been described above that the substrate 102 is porous so as to allow it (and notably at least its portions 106) to be impregnated with the crosslinkable polymer material 107. In this sense, the substrate 102 provided is said to be capable of being impregnated with the crosslinkable polymer material 107 or permeable to the crosslinkable polymer material 107. Notably, this permeability allows the impregnation of the silicone into the substrate 102 when the latter is a fabric, as will be described below.

According to one embodiment, the substrate 102 may be entirely impregnated with the crosslinkable polymer material 107 before the rear faces 104 of the photovoltaic cells 101 are brought into contact with this impregnated substrate 102. This has the advantage of protecting the entire substrate 102 with crosslinked polymer material at the end of the crosslinking of the crosslinkable polymer material 107: the substrate 102 is then coated with crosslinked polymer material.

Preferably, the substrate 102 is a woven substrate: the substrate is a fabric. The fabric has the advantage of being easily impregnated by penetration of the crosslinkable polymer material 107 into the meshes of the fabric (between its threads 108 in FIG. 4), and has the advantage of having adequate flexibility.

Preferably, the weight per unit area of the fabric is between 20 g/m$^2$ and 300 g/m$^2$. This makes it possible notably to ensure the desired flexibility of the fabric, in particular when it is impregnated and, where appropriate, of the fabric after crosslinking of the crosslinkable polymer material 107 used to impregnate it.

Such a fabric may be chosen from a glass-fiber fabric, a fabric of aramid fibers such as Kevlar® (Kevlar® corresponding to poly(p-phenylene terephthalamide), also called PPD-T) or such as Twaron®, corresponding to a p-phenylene terephthalamide (PpPTA), and a fabric of an aromatic polyester such as Vectran®. These fabrics are very particularly suitable for having the photovoltaic cells bonded thereto while retaining flexibility after the crosslinked polymer material has been crosslinked to bond the photovoltaic cells 101 to the fabric.

In general, the substrate 102 has a weight per unit area of between 20 g/m$^2$ and 300 g/m$^2$, this giving it a lightness very particularly suitable for the field of space technology or in the context of a nomadic terrestrial application.

Preferably, as mentioned above, the crosslinkable polymer material 107 comprises silicone or is based on silicone. The crosslinkable polymer material 107 may comprise, and notably consist of, two components A and B. Component A is a base, for example of PDMS (polydimethylsiloxane) type. Component B contains a vulcanizing agent, such as for example a polysiloxane, and a catalyst in order to make it possible for the polymer chains to branch to form a three-dimensional network so that the crosslinkable polymer material 107 can, at the end of its crosslinkage, form a solid and infusible polymer material that is said to be "crosslinked". The advantages of silicone are: that it is a polymer material very particularly suitable for the field of space technology; that it is a good electrical insulator; that silicone has an environmental stability giving it resistance to acids, oxygen and moisture; that silicone does not degrade or only slightly at temperatures ranging from −200° C. to 200° C.; that silicone protects the substrate 102 from ultraviolet radiation; that the silicone also makes it possible to improve the mechanical properties of the substrate 102, notably when the latter is a fabric.

The crosslinkable polymer material 107 may be a silicone formulation of Sylgard® 184 type, or of DOW CORNING® 93-500 type, or else an RTV-S 691 silicone adhesive from the company Wacker.

Figure 5:
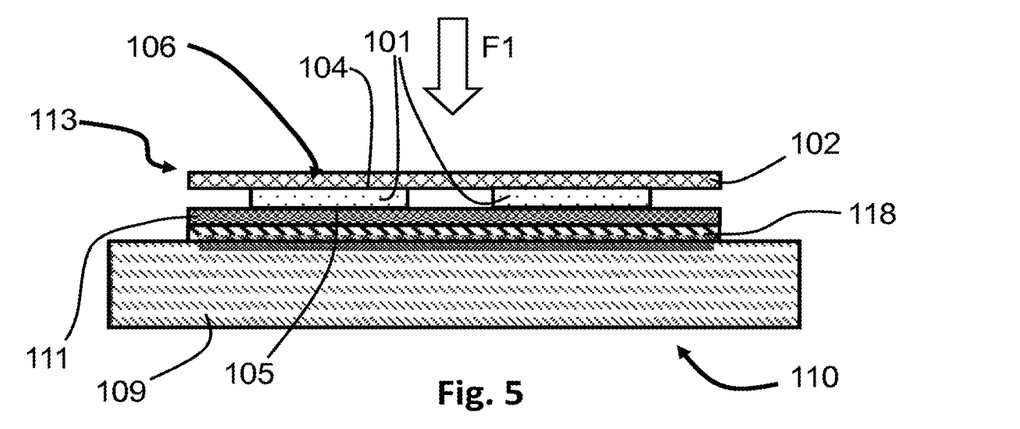
FIG. 5 illustrates, in a sectional view, a stack to be laminated placed in a laminator.

Preferably, the binding method comprises a step of laminating (FIGS. 5 and 6) the substrate 102 and the photovoltaic cells 101 ensuring the crosslinkage of the crosslinkable polymer material 107: the crosslinkable polymer material 107 then passes to a crosslinked state in the lamination step. In other words, the lamination step makes it possible to achieve the crosslinkage. The arrow F1 in FIG. 5 shows that the lamination will tend to press the photovoltaic cells 101 in the direction of a table 109 of a laminator 110. The lamination step makes it possible to improve the bonding of the photovoltaic cells 101 to the substrate 102. Specifically, the lamination step makes it possible to compress the substrate 102 with the photovoltaic cells 101 in order to ensure the rear face 104 of each of the photovoltaic cells 101 is adequately brought into contact with the substrate 102. Advantageously, the lamination step makes it possible to avoid the presence of gas bubbles within the crosslinked polymer material obtained by crosslinking the crosslinkable polymer material 107.

The lamination step is carried out notably under vacuum, for example at 1 mbar, under heat, for example between 60° C. and 150° C., and for a length of time suitable for achieving crosslinking, between 10 min and 240 min for example. Carrying out the lamination step under vacuum makes it possible to remove gas bubbles present in the crosslinkable polymer material 107 with which the substrate 102 and notably its portions 106 are impregnated. Carrying out the lamination step under heat ensures the crosslinkage of the crosslinkable polymer material 107 in a limited length of time. In this sense, the length, pressure and temperature of the lamination step are suitable for crosslinking the crosslinkable material.

Figure 6:
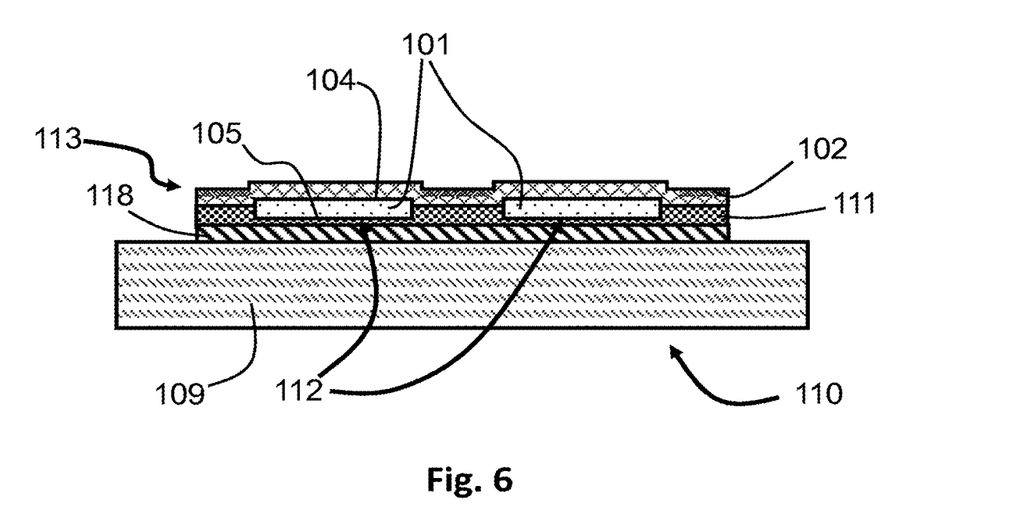
FIG. 6 illustrates, in a sectional view, a lamination step according to one particular embodiment of the binding method according to the present invention.

Preferably, as for example shown in FIGS. 5 and 6, in the lamination step: the front faces 105 of the photovoltaic cells 101 are oriented toward the table 109 of the laminator 110 in which the lamination step is carried out; a soft sheet 111 (also called the flexible sheet) is arranged between the photovoltaic cells 101 and the table 109 of the laminator 110; bringing each of the photovoltaic cells 101 closer to the table 109 of the laminator 110 (passage from FIG. 5 to FIG. 6) causes recesses 112 to be formed in the soft sheet 111. In other words, the lamination step allows the lamination of a stack comprising the soft sheet 111, the photovoltaic cells 101 and the impregnated substrate 102. This has the advantage of limiting the relief of the face of the substrate 102 opposite the photovoltaic cells 101 at the end of the lamination and therefore of the crosslinking of the crosslinkable polymer material 107. The crosslinkable polymer material 107, notably the silicone, with which the substrate 102 is impregnated will have a tendency to migrate downward under gravity during the lamination and, if the relief around the photovoltaic cells 101 is too great, it may be visually observed that the substrate 102 on the periphery of each of the photovoltaic cells 101 discharges the crosslinkable polymer material 107 during the lamination. In this sense, the soft sheet 111 makes it possible for the photovoltaic cells 101 to sink into this soft sheet 111 so that, during the lamination, the substrate 102 takes on a more planar shape than if the soft sheet 111 were not present, this making it possible to limit non-uniformities linked to the discharge of the crosslinkable polymer material 107 mentioned in the present paragraph.

The soft sheet 111 may be made of silicone and have a thickness of between 0.3 mm and 5 mm. Such a soft sheet 111 may have a hardness of between 10 and 50 on the Shore A scale. These features of the soft sheet 111 make it possible to obtain the desired deformation of said sheet, during the lamination step, by pushing the photovoltaic cells 101 into the soft sheet 111, resulting in the formation of the recesses 112.

Figure 7:
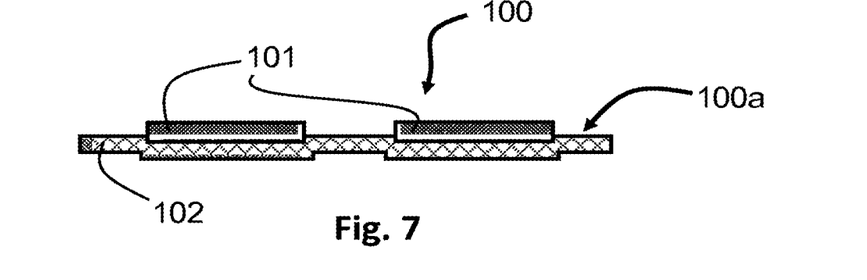
FIG. 7 illustrates a sectional view of the photovoltaic module which may be obtained at the end of the lamination step.
Figure 8:
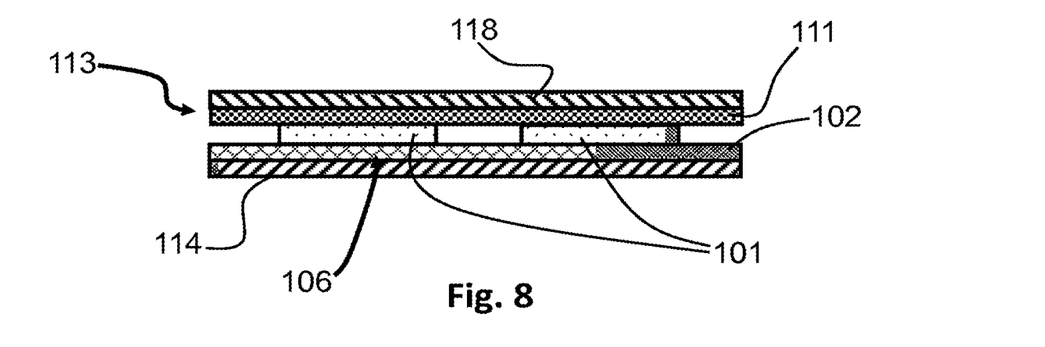
FIG. 8 illustrates a sectional view of a stack, according to one particular embodiment of the binding method, before the implementation of the lamination step.
Figure 9:
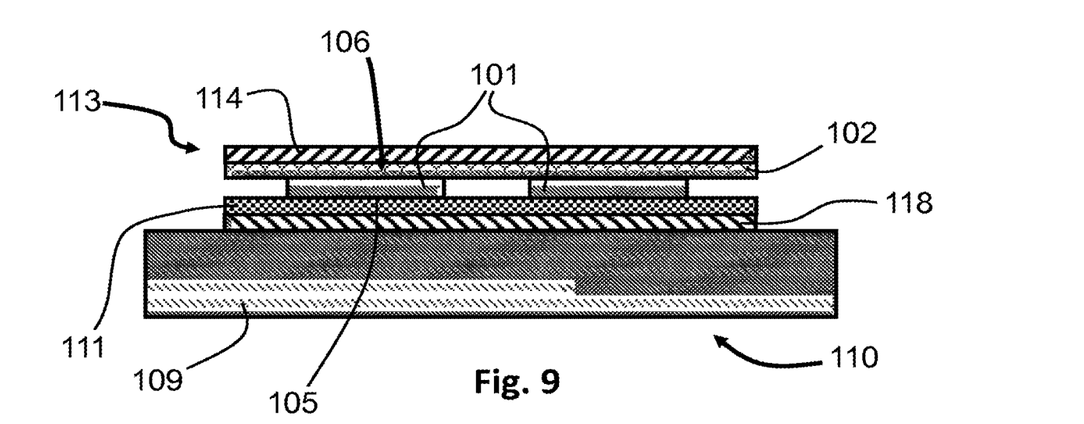
FIG. 9 illustrates, in a sectional view, the stack of FIG. 8 placed in the laminator.
Figure 10:
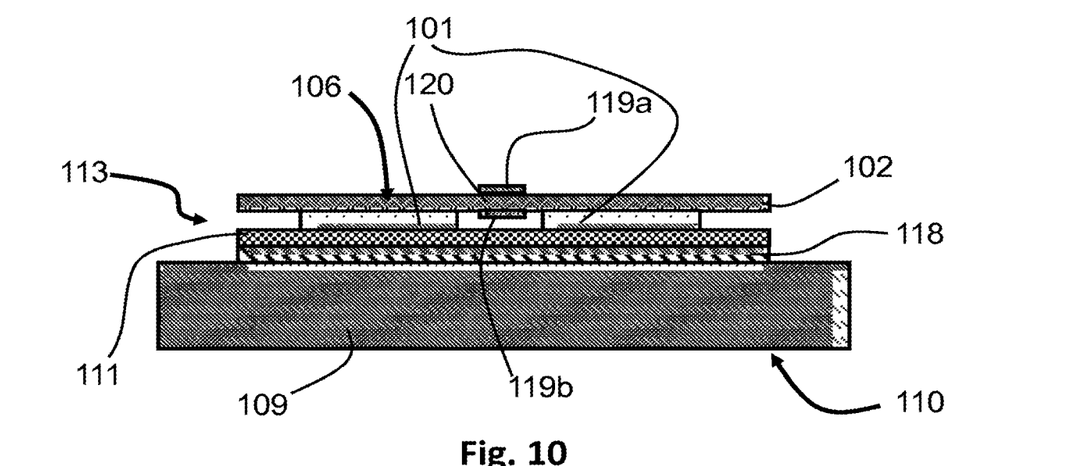
FIG. 10 illustrates, in a sectional view, a variant of FIG. 5 for which the stack to be laminated placed in the laminator comprises adhesives.

At the end of the lamination step, the photovoltaic cells 101 are bonded to the substrate 102, as illustrated in FIG. 7, by the crosslinked polymer material obtained by crosslinking of the crosslinkable polymer material 107 (not shown in FIG. 7).

According to one particular embodiment, notably as illustrated in FIGS. 5, 6 and 8 to 10, the binding method comprises forming a stack 113 comprising successively (notably from the bottom to the top of the stack 113 in FIG. 8 in order to facilitate the impregnation of the substrate 102 and notably of its portions 106, as will be seen below) a first rigid carrier 114, the substrate 102 the portions 106 of which are impregnated with the crosslinkable polymer material 107, the photovoltaic cells 101, which are notably arranged in a coplanar manner and interconnected, the soft sheet 111 and a second rigid carrier 118. The stack 113 thus formed may be inverted before removing the first rigid carrier 114. The second carrier 118 is placed on the table 109 of the laminator 110 (FIG. 9), notably before removing the first rigid carrier 114 (passage from FIG. 9 to FIG. 5). The lamination step ensures the lamination of the stack 113 devoid of the first carrier 114. In other words, the lamination step is implemented by the laminator 110 by laminating the stack 113 devoid of the first carrier 114 (FIG. 6). At the end of the lamination step, the photovoltaic cells 101 are each bonded to the substrate 102 (FIG. 7) by crosslinked polymer material. The photovoltaic cells 101 bonded to the substrate 102 may be recovered from the stack 113 of FIG. 6. This particular stack 113, notably after removal of the first carrier 114, is very particularly suitable for limiting the relief of the face of the substrate 102, and therefore of the carrier 100a of the photovoltaic module 100 (FIG. 7), opposite the photovoltaic cells 101.

In this stack 113, the stacked elements are stacked notably along their thickness, which may therefore be measured parallel to the stacking direction of the stack 113.

This particular embodiment may comprise a step of formulating the silicone forming the crosslinkable polymer material to be used to impregnate the substrate 102. This formulation step may comprise a step of weighing components A and B of the silicone used, with a view to complying with the desired ratio between components A and B. For example, at least 100 g of silicone must be counted per square meter of substrate 102 to be impregnated if the latter is a 100 g/m² glass-fiber fabric. This minimum amount may vary depending on the fabric to be impregnated (thickness, mesh density, surface tension). Components A and B are then mixed in order to homogenize the prepared formulation, for example using a planetary mixer. Preferably, components A and B, once mixed, are degassed in a vacuum chamber, for example under a primary vacuum of 1 mbar to $10^{-3}$ mbar for about 10 minutes, this making it possible to form, from the bubbles present in the mixture, a foam participating in the homogenization of the mixture of components A and B. This degassing time may vary depending on the amount of formulation to be degassed and on its nature. It is also possible to use a planetary mixer to mix and/or degas the silicone formed by mixing components A and B.

In the stack 113, the first and second rigid carriers 114, 118 notably have the function of facilitating the handling of the stack 113 before the lamination step, and notably of making it possible for it to be inverted (passage from FIG. 8 to FIG. 9) after its formation. The rigidity of these first and second carriers 114, 118 is notably suitable for performing this function: they do not deform during handling of the stack 113. Furthermore, the rigidity of the second carrier 118 is such that the latter is not deformed in the lamination step. The first and second carriers 114, 118 may each be a glass plate, for example between 1 mm and 5 mm thick.

Figure 11:
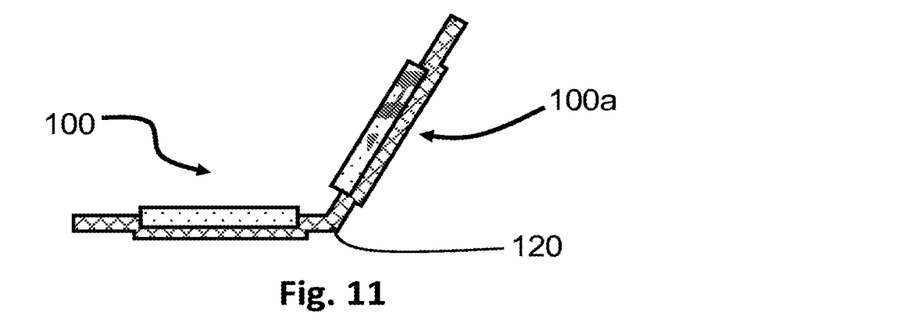
FIG. 11 illustrates a sectional view of the photovoltaic module, according to an embodiment in which it is foldable, during folding.

Optionally, before its impregnation with the crosslinkable polymer material 107, the substrate 102 is locally protected by adhesive tapes 119a, 119b in order to form at least one preferential zone 120 for folding the carrier 100a of the photovoltaic module 100 (FIGS. 10 and 11) devoid of crosslinked polymer material. This protection by adhesive tapes 119a, 119b is also called masking. The role of the adhesive tapes 119a, 119b is to form parts of the substrate 102 which must not be impregnated with crosslinkable polymer material 107. The adhesive tapes 119a, 119b may be removed after crosslinking of the crosslinkable polymer material 107; the photovoltaic module 100 then obtained may be easily folded at the level of the preferential folding zone 120. The use of adhesive tapes is not necessarily mandatory if it is the aim to obtain a foldable photovoltaic module 100 insofar as the carrier 100a, formed by the substrate 102 and the crosslinked polymer material, may also be flexible/foldable depending on the substrate 102 and on the crosslinkable polymer material used.

Notably, in order to impregnate the substrate 102 (and notably the portions 106 of the substrate 102), the formation of the stack 113 may comprise (FIGS. 12 and 13) successively:
  forming a layer 121 of crosslinkable polymer material (in particular of previously formulated silicone), for example on the first carrier 114,
  bringing a first face 102a of the substrate 102 into contact with the layer 121 of crosslinkable polymer material, this making it possible for the crosslinkable polymer material of the layer 121 of crosslinkable polymer material to penetrate into the substrate 102,
  adding crosslinkable polymer material to a second face 102b of the substrate 102 opposite to the first face 102a of the substrate 102, this making it possible to further add crosslinkable polymer material in order to ensure adequate impregnation of the portions 106 of the substrate 102,
  smoothing the substrate 102 in order to increase the uniformity of the impregnation of the portions 106 of the substrate 102 with the crosslinkable polymer material 107.

Figure 12:
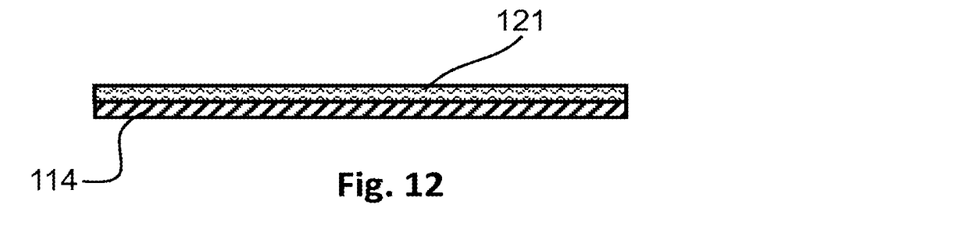
FIG. 12 illustrates, in a sectional view, a step according to one embodiment of the binding method.
Figure 13:
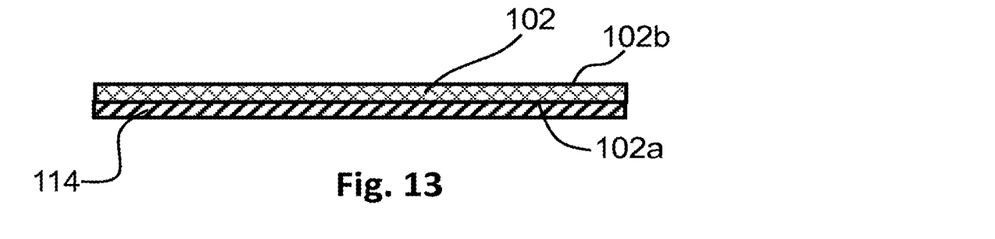
FIG. 13 illustrates, in a sectional view, a step according to one embodiment of the binding method.

In particular, the layer 121 of crosslinkable polymer material may be formed by coating, for example using a brush or a spray, or by dipping, on an area which is at least equivalent to the dimensions of the substrate 102 orthogonally to its thickness (FIG. 12). When the substrate 102 is laid on the layer 121, the result is that the crosslinkable polymer material of the layer 121 is absorbed by the substrate 102 (FIG. 13). Crosslinkable polymer material may be added to the second face 102b of the substrate 102 using a brush. The substrate 102 may be smoothed using a scraper or a spike roller in order to increase the uniformity of the impregnation of the crosslinkable polymer material 107 over the entire substrate 102: smoothing therefore corresponds to scraping the surface of the substrate 102. This has the advantage that the impregnation is carried out directly during the production of the stack: as a result the binding method is optimized by limiting the number of technological steps.

In other words, it will be understood from what has been described above that, in general, in order to improve the impregnation of the substrate 102, the substrate 102 may be impregnated with the crosslinkable polymer material by applying crosslinkable polymer material to both sides of the substrate 102, which sides are opposite along its thickness.

After impregnation of the substrate 102, the photovoltaic cells 101, which are notably interconnected and preferably each equipped with an individual protective element on the front face, may be laid on the impregnated substrate 102 before finalizing the stack 113, notably by positioning the soft sheet 111 and the second carrier 118 therein. Finally, the stack 113 may be inverted (by virtue of the first and second carriers 114, 118 being present) in order to place the second carrier 118 on the table 109 before removing the first carrier 114 then laminating the stack 113 devoid of this first carrier 114.

One particular embodiment is now described which makes it possible to bond photovoltaic cells 101, which are interconnected and each equipped with an individual protective element 101a on its front face 105 (FIG. 14), to the substrate 102 formed by a polyaramid-fiber fabric impregnated with Sylgard® 184 silicone from the company Dow Corning. According to this example, the binding method comprises: cutting the substrate 102, which is made of polyaramid fibers, and has a weight per unit area of 60 g/m$^2$, in order to obtain a square of 40 cm by 40 cm and 135 micrometers thick; depositing a bonding primer 101b, using for example a solution of reactive siloxanes and silanes in an organic solvent (such as for example WACKER® PRIMER G790), in order to form a layer between 1 micrometer and 10 micrometers thick, and with a weight per unit area of between 5 g/m$^2$ and 50 g/m$^2$, this layer being formed on the photovoltaic cells 101 (FIG. 14) in order to form the rear faces 104 of these photovoltaic cells 101 with a view to improving the adhesion of the silicone to the photovoltaic cells 101 during its crosslinking; preparing a formulation of 25 grams of Sylgrad® 184 silicone while complying with a 10:1 ratio for parts A and B, respectively; mixing the formulation, then degassing it in a vacuum chamber for about 10 minutes; impregnating the substrate 102 with the formulation, for example using a brush in the manner described previously; scraping the substrate 102 in order to increase the uniformity of the amount of silicone within the substrate 102; positioning the photovoltaic cells 101, which are interconnected and each equipped with its individual protective element, on the impregnated substrate 102; then positioning the soft sheet 111 and the second rigid carrier 118, which is notably made of glass, in order to finalize the stack 113 to be inverted, which may also comprise the first carrier 114; inverting the stack 113 on the table 109 of the laminator 110 and, notably, after this inversion and before the lamination, removing the first carrier 114; laminating the stack 113 thus produced, for example under vacuum at 140° C. for at least 15 minutes and preferably while pressing down on the stack, in order to make it possible to push the photovoltaic cells 101 into the soft sheet 111 and to crosslink the crosslinkable polymer material 107; cleaning the individual protective elements 101a if necessary in the event of flow of crosslinkable polymer material 107 onto these individual protective elements 101a during the lamination. According to this particular example, at the end of the lamination, not only does the crosslinked silicone entirely envelop the substrate 102, but also strongly binds the photovoltaic cells 101 to this substrate 102. After crosslinking, the substrate 102 and the crosslinked polymer material form a carrier for the photovoltaic module weighing 120 g/m$^2$ (60 g/m$^2$ of which is fabric).

Figure 14:
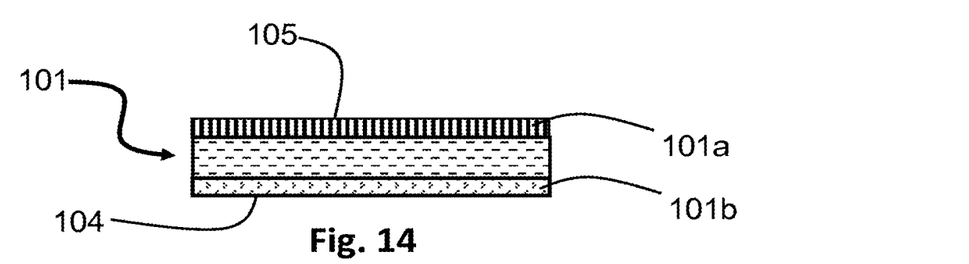
FIG. 14 illustrates one particular example of a photovoltaic cell, seen in section, to be bonded to the substrate according to the present invention.

In a manner applicable to everything that has been described previously, for example as shown in FIG. 14, each photovoltaic cell 101 may comprise the individual protective element 101a forming its front face 105: the photovoltaic cell 101 is then an encapsulated photovoltaic cell very particularly suitable for the field of space technology. Thus, the photovoltaic cells 101 brought into contact with the impregnated portions 106 of the substrate 102 are preferably interconnected (that is to say electrically connected) and preferably each comprise an individual protective element 101a forming its front face 105. Such a photovoltaic cell 101 with an individual protective element 101a may also comprise connection terminals for connecting it to at least one other photovoltaic cell. The rear face 104 of the photovoltaic cell 101 may be formed by an electrode of this photovoltaic cell 101. FIG. 14 illustrates in more detail such a photovoltaic cell 101 comprising the individual protective element 101a forming the front face 105 of the cell. The individual protective element 101a makes it possible to encapsulate the photovoltaic cell on the side of the photovoltaic cell suitable for receiving the radiation to be converted into electrical energy. This individual protective element 101a may be formed by borosilicate glass doped with cerium and may have a thickness between 50 micrometers and 200 micrometers. Typically, the individual protective element 101a is bonded to the rest of the photovoltaic cell 101 by a transparent silicone layer 30 micrometers to 100 micrometers thick.

Each photovoltaic cell may be of III-V type.

In a manner applicable to everything that has been described previously, each photovoltaic cell 101 may comprise a layer 101b as a bonding primer forming its rear face 104, notably in contact with the electrode arranged on the side of the rear face of the photovoltaic cell. "Bonding primer" is understood to mean a material which promotes the bonding of the crosslinked polymer material obtained from the crosslinkable polymer material 107. For example, such a bonding primer may be such as that described previously (for example WACKER® PRIMER G790) if the crosslinkable polymer material is silicone. A person skilled in the art will be able to choose the right bonding primer depending on the crosslinkable polymer material 107 to be used in the binding method.

The crosslinkable polymer material 107 used may be chosen depending on requirements such as for example its resistance to ultraviolet rays or to certain radiation.

The present invention is industrially applicable to the manufacture of photovoltaic modules, notably intended for the space industry. The photovoltaic module produced according to the present binding method is very particularly suitable for this photovoltaic module being on board a space launcher before being deployed in space.

The invention claimed is:

1. A method for binding photovoltaic cells to a substrate, each photovoltaic cell comprising a rear face and a front face, wherein said binding method comprises:
providing the substrate, said substrate being flexible and impregnable,
impregnating portions of the substrate with a crosslinkable polymer material, said portions being impregnated along the thickness of the substrate, with a view to bonding the photovoltaic cells to the substrate,
bringing the rear faces of the photovoltaic cells into contact with impregnated portions of the substrate,
crosslinking the crosslinkable polymer material, and
laminating the substrate and the photovoltaic cells ensuring crosslinkage of the crosslinkable polymer material, the photovoltaic cells brought into contact with the impregnated portions of the substrate being interconnected and each comprising an individual protective element forming its front face.

2. The binding method as claimed in claim 1, wherein each impregnated portion of the substrate has a surface only part of which makes contact with the rear face of the photovoltaic cell brought into contact with said impregnated portion of the substrate.

3. The binding method as claimed in claim 1, wherein, in the laminating:
   the front faces of the photovoltaic cells are oriented toward a table of a laminator,
   a soft sheet is arranged between the photovoltaic cells and the table of the laminator, and
   bringing each of the photovoltaic cells closer to the table of the laminator causes recesses to be formed in the soft sheet.

4. The binding method as claimed in claim 3, further comprising: forming a stack, said stack comprising successively, from the bottom of the stack to the top of the stack, a first rigid carrier, the substrate the portions of which are impregnated with the crosslinkable polymer material, the photovoltaic cells, the soft sheet and a second rigid carrier, and wherein:
   the second carrier is placed on the table of the laminator,
   the laminating ensures lamination of the stack devoid of the first carrier, and
   at the end of the laminating, the photovoltaic cells are each bonded to the substrate by crosslinked polymer material.

5. The binding method as claimed in claim 4, wherein, in order to impregnate the portions, forming the stack comprises successively:
   forming a layer of crosslinkable polymer material,
   bringing a first face of the substrate into contact with the layer of crosslinkable polymer material,
   adding crosslinkable polymer material to a second face of the substrate opposite the first face of the substrate, and
   smoothing the substrate in order to increase uniformity of the impregnation of the portions of the substrate with the crosslinkable polymer material.

6. The binding method as claimed in claim 1, wherein the crosslinkable polymer material is a silicone.

7. The binding method as claimed in claim 1, wherein the substrate is a fabric.

8. The binding method as claimed in claim 7, wherein the fabric is selected from the group consisting of: a glass-fiber fabric, an aramid-fiber fabric and an aromatic-polyester fabric.

9. The binding method as claimed in claim 7, wherein a weight per unit area of the fabric is between 20 $g/m^2$ and 300 $g/m^2$.

10. The binding method as claimed in claim 1, wherein the rear faces of the photovoltaic cells are brought into contact with the impregnated portions of the substrate after the impregnation of the portions of the substrate with the crosslinkable polymer material.

* * * * *